United States Patent [19]

Taneya et al.

[11] Patent Number: 4,716,129
[45] Date of Patent: Dec. 29, 1987

[54] METHOD FOR THE PRODUCTION OF SEMICONDUCTOR DEVICES

[75] Inventors: Mototaka Taneya; Sadayoshi Matsui; Mitsuhiro Matsumoto, all of Tenri, Japan

[73] Assignee: Sharp Kabushiki Kaisha, Osaka, Japan

[21] Appl. No.: 816,569

[22] Filed: Jan. 6, 1986

[30] Foreign Application Priority Data

Jan. 14, 1985 [JP] Japan .................................. 60-4760

[51] Int. Cl.⁴ ........................................... H01L 21/208
[52] U.S. Cl. ...................................... 437/96; 437/120; 437/129; 437/130; 437/133
[58] Field of Search .............. 148/171, 172; 29/569 L, 29/576 E; 372/45, 48

[56] References Cited

U.S. PATENT DOCUMENTS

| | | | |
|---|---|---|---|
| 4,099,999 | 7/1978 | Burnham et al. | 148/171 X |
| 4,255,755 | 3/1981 | Itoh et al. | 148/171 X |
| 4,326,176 | 4/1982 | Aiki et al. | 29/569 L X |
| 4,371,968 | 2/1983 | Trussell et al. | 148/171 X |
| 4,372,791 | 2/1983 | Hsieh | 29/569 L |
| 4,425,650 | 1/1984 | Mito et al. | 29/569 L |
| 4,507,157 | 3/1985 | Oliver | 29/569 L |
| 4,509,996 | 4/1985 | Greene et al. | 148/171 |
| 4,578,127 | 3/1986 | Gossard et al. | 148/175 |
| 4,613,387 | 9/1986 | Turley | 148/171 |
| 4,632,709 | 12/1986 | Taneya et al. | 29/569 L |

Primary Examiner—George T. Ozaki
Attorney, Agent, or Firm—Birch, Stewart, Kolasch & Birch

[57] ABSTRACT

A method for the production of semiconductor devices, using liquid phase epitaxy of semiconductors of Groups III to V of the periodic table, in which on a Te-doped first layer, a second layer having a polarity different from that of the first layer is grown, wherein a non-Te-doped third layer having the same polarity as the first layer is grown between the first layer and the second layer. Another method in which on a Te-doped first layer, a second layer having a principal crystal composition different from that of the first layer is grown, wherein a non-Te-doped third layer having the same principal crystal composition of the first layer is grown between the first layer and the second layer.

11 Claims, 6 Drawing Figures

METHOD FOR THE PRODUCTION OF SEMICONDUCTOR DEVICES

BACKGROUND OF THE INVENTION

1. Field of the invention:

This invention relates to a method for the production of semiconductor devices which minimizes undesirable phenomena such as non-uniform segregation of tellurium at the interface of a p-n junction or a heterojunction in semiconductors of Groups III to V of the periodic table which contains Te 2. Description of the prior art:

Liquid-phase epitaxy of semiconductors of Groups III to V of the periodic table is widely used as a conventional production method for semiconductor lasers and light-emitting diodes. When such devices are produced, Te is often used as an n-impurity. This makes it possible to obtain a crystal of high electron density with relative ease, and the process can be controlled readily.

However, there is a lamellar distribution of areas on the surface of the layer in which Te is used as an impurity where the density of Te is extremely high. In this case, when additional crystals are being grown continuously, undesirable effects often occur which result in certain characteristics exhibited by the semiconductor devices, such as a decrease in the uniformity of additional crystals grown on the surface of substrate crystals and an increase at the interface of recombination centers. For example, FIG. 3 shows a wafer which is produced as follows: On a p-GaAs substrate 31, a Te-doped AlGaAs current blocking layer ($10^{19}$ cm$^{-3}$) 32 having a thickness of 0.7 $\mu$m and a non-Te-doped GaAs surface-protective layer 33 having a thickness of 0.1 $\mu$m are grown by liquid phase epitaxy. When the thin semiconductor layer 33 is grown on the layer 32 containing Te in a high concentration, the morphology of the crystal surface is lamellar, as shown in FIG. 4. It has also been found that the non-Te-doped GaAs surface-protective layer 33 does not grow in the areas represented by the hatched areas in FIG. 4. The lamellar growth of this thin layer 33 originates in the non-uniform segregation of Te on the surface of the underlying GaAs current blocking layer 32. The form of the Te segregation affects the shape of the lamellae. Partial growth of the surface-protective layer 33 means that the AlGaAs current blocking layer 32 containing Al on the surface thereof is partially exposed to air. When this wafer is used as a substrate for subsequent crystal growth, growth is not possible in the exposed areas, becoming a major problem.

Problems also arise when this method is used in the production of semiconductor laser devices. FIG. 5 is a sectional view of a common semiconductor laser device of double heterostructure. On an n-GaAs substrate 51, a Te-doped n-Al$_x$Ga$_{1-x}$As cladding layer 52, a Mg-doped p-Al$_y$Ga$_{1-y}$As active layer 53, a Mg-doped p-Al$_x$Ga$_{1-x}$As cladding layer 54 and a Zn-doped p$^+$-GaAs ohmic contact layer 55 are successively grown by liquid phase epitaxy. This device has the same structure as the above-mentioned one in that the active layer (the p-Al$_y$Ga$_{1-y}$As active layer) 53 is formed on the Te-doped crystal cladding layer (the n-Al$_x$Ga$_{1-x}$As cladding layer) 52. The amount of Te doped here is $10^{18}$ cm$^{-3}$, which is about one tenth of that of the example given above. For that reason, the undesirable effect of partial growth of the active layer 53 does not occur. However, various analyses suggest that the interface between the n-cladding layer 52 and the active layer 53 has scattered regions of mixed crystals and of non-radiate recombination centers. These have undesirable effects on the characteristics of the finished semiconductor laser device. Some examples of such undesirable effects include an increase in threshold current, a lowering of the differential quantum efficiency, and a decrease in the life-span of the device.

SUMMARY OF THE INVENTION

The method for the production of semiconductor devices of this invention which overcomes the above-discussed and numerous other disadvantages and deficiencies of the prior art, is a method, using liquid phase epitaxy of semiconductors of Groups III to V of the periodic table, in which on a Te-doped first layer, a second layer having a polarity different from that of the first layer is grown, wherein a non-Te-doped third layer having the same polarity as the first layer is grown between the first layer and the second layer.

The method for the production of semiconductor devices of this invention is also a method, using liquid phase epitaxy of semiconductors of Groups III to V of the periodic table, in which on a Te-doped first layer, a second layer having a principal crystal composition different from that of the first layer is grown, wherein a non-Te-doped third layer having the same principal crystal composition as the first layer is grown between the first layer and the second layer.

Thus, the invention described herein makes possible the object of providing a method for the production of semiconductor devices which minimizes undesirable effects on semiconductor device characteristics caused by the non-uniform segregation of Te at the interface when a p-n junction or when a heterojunction is formed in Te-doped semiconductor layers, so that devices can be produced with an excellent reproducibility.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The method of this invention is a method, using liquid phase epitaxy of semiconductors of Groups III to V of the periodic table, in which on a Te-doped first layer, a second layer having a polarity or a principal crystal composition which is different from that of the first layer is grown, wherein a non-Te-doped third layer is grown between the first layer and the second layer, thereby preventing the Te-doped first layer from contacting the interface of a p-n junction or a heterojunction formed in the semiconductor devices. The polarity and the principal crystal composition of the third layer are selected to be the same as those of the first layer, thereby preventing a change of the device characteristics to be caused by the use of the third layer.

EXAMPLE 1

Figure 1A:
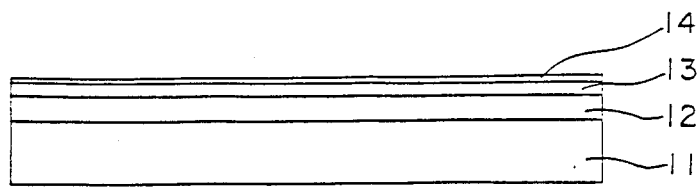
FIG. 1(a) is a first view showing a wafer produced according to this invention.
Figure 3:
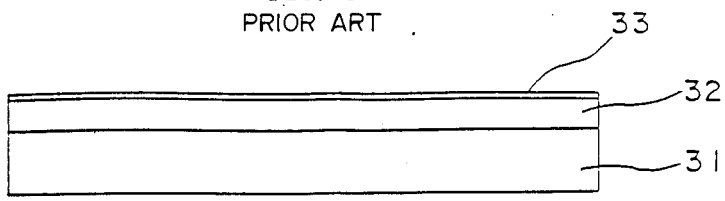
FIG. 3 is a front view showing a conventional wafer.
Figure 4:
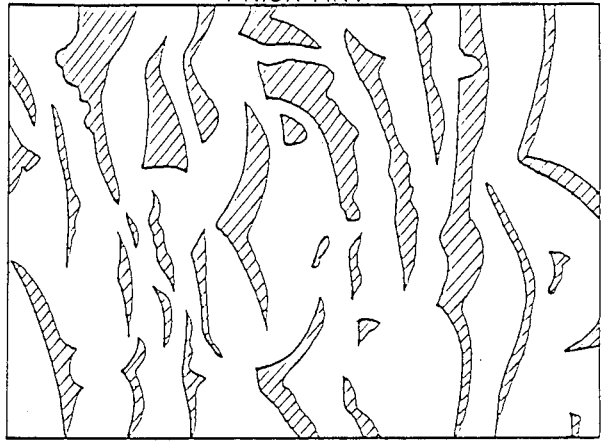
FIG. 4 is the morphology of the crystal surface of the wafer shown in FIG. 3.

FIG. 1(a) shows a wafer according to this invention, which is produced as follows: On a p-GaAs substrate 11, a Te-doped $Al_xGa_{1-x}As$ current blocking layer (approximately $10^{19}$ cm$^{-3}$) 12 having a thickness of 0.6 μm, an $Al_xGa_{1-x}As$ buffer layer 13 having a thickness of 0.3 μm, and a GaAs surface-protective layer 14 having a thickness of 0.1 μm are successively grown by liquid phase epitaxy. This wafer is constructed in such a manner that the non-Te-doped $Al_xGa_{1-x}As$ buffer layer 13 having the same crystal composition as the Te-doped $Al_xGa_{1-x}As$ current blocking layer 12 is sandwiched between the Te-doped $Al_xGa_{1-x}As$ current blocking layer 12 and the GaAs surface-protective layer 14, and accordingly the structure of this wafer is quite different from that of the conventional wafer shown in FIG. 3. Due to the buffer layer 13, the formation of a lamellar unevenness on the surface of the Te-doped layer 12 is suppressed, so that the surface-protective layer 14 can be grown with a uniformity over the whole surface of the substrate, resulting in a growth wafer having a mirror-like surface.

EXAMPLE 2

Figure 1B:
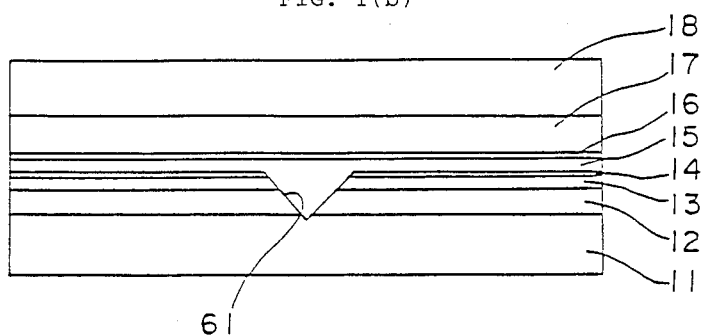
FIG. 1(b) is a front view showing a semiconductor laser device produced using the wafer shown in FIG. 1(a) according to this invention.

FIG. 1(b) shows a semiconductor laser device which is produced using the above-mentioned wafer of Example 1 as follows: A channel 61 having a width of 4.0 μm is formed on the wafer shown in FIG. 1(a) in a manner that it reaches the p-substrate 11 through the layers 14, 13 and 12, followed by a liquid phase epitaxial growth treatment to successively grow a p-$Al_yGa_{1-y}As$ cladding layer 15, a p- (or n-) $Al_zGa_{1-z}As$ active layer 16, an n-$Al_yGa_{1-y}As$ cladding layer 17 and an n$^+$-GaAs ohmic contact layer 18 on the surface-protective layer 14 including the channel 61 (wherein $0<x<z<y<1$). Since the surface-protective layer 14 has been grown uniformly over the whole surface of the substrate, subsequent crystal growth can be attained, as well, with a uniformity over the whole surface of the wafer. This desirable effect results from the existence of the buffer layer 13.

EXAMPLE 3

Figure 2:
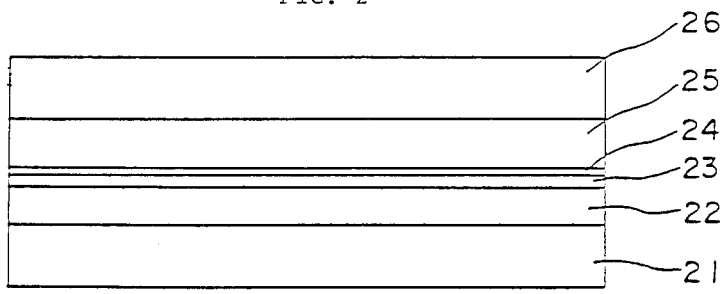
FIG. 2 is a front view showing another semiconductor laser device according to this invention.
Figure 5:
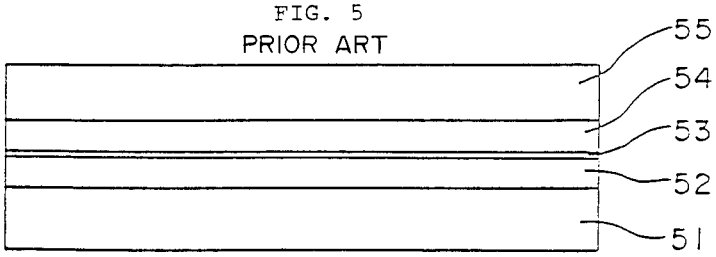
FIG. 5 is a front view showing another conventional wafer.

FIG. 2 shows another wafer according to this invention, which is produced, as mentioned below, by the application of the method of this invention to a conventional wafer in which an active layer is grown on a Te-doped layer. On an n-GaAs substrate 21, a Te-doped n-$Al_xGa_{1-x}As$ cladding layer (approximately $10^{18}$ cm$^{-3}$) 22 having a thickness of 0.6 μm, a non-Tedoped n-$Al_xGa_{1-x}As$ buffer (cladding) layer 23 having a thickness of 0.2 μm, an n- (or p-) $Al_yGa_{1-y}As$ active layer 24 having a thickness of 0.1 μm, a p-$Al_xGa_{1-x}As$ cladding layer 25 having a thickness of 0.8 μm, and a p$^+$-GaAs ohmic contact layer 26 having a thickness of 1.0 μm are successively grown by liquid phase epitaxy. As compared to the conventional wafer shown in FIG. 5 in which the active layer 53 is grown directly on the Te-doped cladding layer 52, in the resulting wafer, the formation of lamellar unevenness on the surface of the Te-doped layer 22 is suppressed due to the existence of the non-Te-doped buffer layer 23 containing Si, thereby allowing improvement of crystallization of either the active layer 24 or the interface between the active layer 24 and the buffer layer 23. Thus, the threshold current, the differential quantum efficiency, and the life-span of a semiconductor laser device resulting from the above-mentioned wafer can be improved.

Although Si was added as an impurity to the buffer layer 23 in the above-mentioned examples, other atoms functioning as an n-impurity such as Sn, etc., can be used with the same effect as the above-mentioned. In the above-mentioned examples, both the polarity and the principal crystal composition of the layer 23 containing no Te are the same as those of the layer 22 containing Te. It is also noted that, strictly speaking, there is a possibility of the mixing of Te into the non-Te-doped layer 13 or 23 due to melt-back of the Te-doped layer 12 or 22, however, the degree of the mixing of Te due to melt-back seems to be very low in contrast to Te that is added or doped into the non-Te-doped layer 13 or 23.

Various modifications of the wafers or the semiconductor laser devices according to this invention include:
(i) Wafers or devices which are designed using other semiconductor materials of Groups III to V of the periodic table instead of the AlGaAs/GaAs systems.
(ii) Other semiconductor devices instead of the semiconductor laser devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:
1. A method for the production of semiconductor devices which comprises:
forming a non-Te-doped layer on a Te-doped layer, said non-Te-doped layer having the same polarity as said Te-doped layer, and
forming an upper layer on said non-Te-doped layer, said upper layer having a polarity different from that of said Te-doped layer,
wherein said layers comprise semiconductors of Groups III to V of the periodic table and wherein said layers are formed by liquid phase epitaxy.
2. The method according to claim 1, wherein said non-Te-doped layer has the same principal crystal composition as said Te-doped layer and wherein said upper layer has a principal crystal composition different from that of said Te-doped layer.
3. The method of claim 2, wherein said Te-doped layer is formed on a substrate layer, said non-Te-doped layer is a buffer layer, an active layer is formed on said buffer layer, a second cladding layer is formed on said active layer, and a contact layer is formed on said second cladding layer.
4. The method of claim 3, wherein said substrate layer comprises n-GaAs, said first cladding layer and said buffer layer comprise n-AlGaAs, said active layer comprises n- or p-AlGaAs, said second cladding layer comprises p-AlGaAs, and said contact layer comprises p-GaAs.

5. The method according to claim 1, wherein said Te-doped layer is a current blocking layer, said current blocking layer is formed on a substrate layer, said non-Te-doped layer is a buffer layer formed on said current blocking layer, and wherein a surface-protective layer is formed on said buffer layer.

6. The method according to claim 5, wherein a channel reaching from said surface-protective layer to said substrate layer is formed, a first cladding layer is formed on said surface-protective layer, an active layer is formed on said first cladding layer, a second cladding layer is formed on said active layer, and a contact layer is formed on said second cladding layer.

7. The method according to claim 6, wherein said substrate layer comprises p-GaAs, said current blocking layer and said buffer layer comprise AlGaAs, said surface-protective layer comprises GaAs, said first cladding layer comprises p-AlGaAs, said active layer comprises p- or n-AlGaAs, said second cladding layer comprises n-AlGaAs, and said contact layer comprises n-GaAs.

8. A method for the production of semiconductor devices which comprises:
 forming a non-Te-doped layer on a Te-doped layer, said non-Te-doped layer having the same principal crystal composition as said Te-doped layer, and
 forming an upper layer on said non-Te-doped layer, said upper layer having a principal crystal composition different from that of said Te-doped layer,
 wherein said layers comprise semiconductors of Groups III of IV of the periodic table and wherein said layers are formed by liquid phase epitaxy.

9. The method according to claim 8, wherein said Te-doped layer is a current blocking layer, said current blocking layer is formed on a substrate layer, said non-Te-doped layer is a buffer layer formed on said current blocking layer, and wherein a surface-protective layer is formed on said buffer layer.

10. The method according to claim 9, wherein a channel reaching from said surface-protective layer to said substrate layer is formed, a first cladding layer is formed on said surface-protective layer, an active layer is formed on said first cladding layer, a second cladding layer is formed on said active layer, and a contact layer is formed on said second cladding layer.

11. The method according to claim 10, wherein said substrate layer comprises p-GaAs, said current blocking layer and said buffer layer comprise AlGaAs, said surface-protective layer comprises GaAs, said first cladding layer comprises p-AlGaAs, said active layer comprises p- or n-AlGaAs, said second cladding layer comprises n-AlGaAs, and said contact layer comprises n-GaAs.

* * * * *